(12) United States Patent
Cao et al.

(10) Patent No.: US 9,470,916 B2
(45) Date of Patent: Oct. 18, 2016

(54) ARRAY SUBSTRATE, METHOD OF MANUFACTURING ARRAY SUBSTRATE, AND LIQUID CRYSTAL DISPLAY

(71) Applicants: Shanghai Tianma Micro-Electronics Co., Ltd., Shanghai (CN); Tianma Micro-Electronics Co., Ltd., Shenzhen (CN)

(72) Inventors: Zhaokeng Cao, Shanghai (CN); Junhui Lou, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 164 days.

(21) Appl. No.: 14/275,154

(22) Filed: May 12, 2014

(65) Prior Publication Data

US 2015/0185521 A1 Jul. 2, 2015

(30) Foreign Application Priority Data

Dec. 31, 2013 (CN) .......................... 2013 1 0751479

(51) Int. Cl.

| G02F 1/133 | (2006.01) |
|---|---|
| H01L 21/311 | (2006.01) |
| H01L 21/4757 | (2006.01) |
| H01L 21/768 | (2006.01) |
| H01L 27/12 | (2006.01) |
| H01L 29/66 | (2006.01) |
| H01L 29/786 | (2006.01) |

(52) U.S. Cl.
CPC ...... *G02F 1/13306* (2013.01); *H01L 21/31111* (2013.01); *H01L 21/47573* (2013.01); *H01L 21/76802* (2013.01); *H01L 27/124* (2013.01); *H01L 27/1222* (2013.01); *H01L 27/1225* (2013.01); *H01L 27/1259* (2013.01); *H01L 29/66765* (2013.01); *H01L 29/66969* (2013.01); *H01L 29/7869* (2013.01); *H01L 29/78669* (2013.01)

(58) Field of Classification Search
CPC .......... G02F 1/13306; G02F 1/13454; H01L 27/1214; H01L 27/124; H01L 27/1225; H01L 27/1259; H01L 29/66765; H01L 29/66969; H01L 29/78669; H01L 29/7869; H01L 21/7682; H01L 21/47573
See application file for complete search history.

(56) References Cited

U.S. PATENT DOCUMENTS

2005/0017244 A1* 1/2005 Hoffman ............. H01L 29/7869
257/72
2007/0018165 A1* 1/2007 Yamazaki ............. H01L 27/124
257/59

(Continued)

FOREIGN PATENT DOCUMENTS

| CN | 101609236 A | 12/2009 |
|---|---|---|
| CN | 103081108 A | 5/2013 |

(Continued)

OTHER PUBLICATIONS

1st Office Action as issued in corresponding Chinese Application No. 201310751479.8, dated Mar. 2, 2016.

*Primary Examiner* — Nathanael R Briggs
(74) *Attorney, Agent, or Firm* — Alston & Bird LLP

(57) ABSTRACT

An array substrate is disclosed. The array substrate includes a display area, and a driving circuit arranged around the display area. The driving circuit includes a plurality of TFTs, and at least one of the TFTs includes a first sub-TFT and a second sub-TFT. In addition, the first sub-TFT is electrically connected to the second sub-TFT via a first bridge, and the first bridge includes a transparent conductive material.

20 Claims, 8 Drawing Sheets

(56) References Cited

U.S. PATENT DOCUMENTS

2013/0188110 A1 7/2013 Miyamoto
2015/0318311 A1 11/2015 Cheng et al.

FOREIGN PATENT DOCUMENTS

CN 103268049 A 8/2013
CN 103354218 A 10/2013

* cited by examiner

ARRAY SUBSTRATE, METHOD OF MANUFACTURING ARRAY SUBSTRATE, AND LIQUID CRYSTAL DISPLAY

CROSS REFERENCE TO RELATED APPLICATIONS

This application claims the benefit of priority to Chinese Patent Application No. 201310751479.8, filed with the Chinese Patent Office on Dec. 31, 2013 and entitled "ARRAY SUBSTRATE, METHOD OF MANUFACTURING ARRAY SUBSTRATE, AND LIQUID CRYSTAL DISPLAY", the content of which is incorporated herein by reference in its entirety.

TECHNICAL FIELD

The disclosure relates to the field of flat panel display technology, and in particular to an array substrate, a method of manufacturing an array substrate, and a liquid crystal display panel.

BACKGROUND OF THE INVENTION

FIG. 1 is a schematic structural diagram of a display panel 1 in an existing technology. As shown in FIG. 1, the display panel 1 includes a display area 10, a gate driving circuit 20 arranged around the display area 10, an integrated circuit (IC) 30 disposed below the display area 10 and arranged at an adhesive frame region (not shown for clarity) on the gate driving circuit. The display area 10 includes pixel units, and multiple gate lines and multiple data lines are disposed around the pixel units. Each of the pixel units includes a pixel electrode. The pixel units display an image under an on-off control of thin film transistors (TFTs). The driving circuit 20 also includes multiple TFTs. Each of the TFTs is connected to one gate line or one data line. A driving voltage is applied to a corresponding gate line or a corresponding data line under the control of the TFT to drive the gate line or the data line.

In the TFT structure of the conventional driving circuit, the adhesive frame around the display area cannot be cured effectively because the gate shields the light.

BRIEF SUMMARY OF THE INVENTION

One inventive aspect is an array substrate. The array substrate includes a display area, and a driving circuit arranged around the display area. The driving circuit includes a plurality of TFTs, and at least one of the TFTs includes a first sub-TFT and a second sub-TFT. In addition, the first sub-TFT is electrically connected to the second sub-TFT via a first bridge, and the first bridge includes a transparent conductive material.

Another inventive aspect is a method of manufacturing an array substrate. The method includes preparing a substrate, depositing a first metal layer, patterning the first metal layer to form a first gate and a second gate, and depositing a first insulating material on the first gate and the second gate to form a gate insulating layer. The method also includes depositing a semiconductor material on the gate insulating layer, patterning the deposited semiconductor material to form a first active layer on the first gate and to form a second active layer on the second gate, and depositing a second insulating material on the first active layer and the second active layer to form an etching barrier layer. The method further includes depositing a second metal material on the etching barrier layer, patterning the deposited second metal material to form a source and a drain, depositing a first transparent conductive material, and patterning the deposited first transparent conductive material to form a first bridge. The method also includes depositing a third insulating material on the etching barrier layer, the source, the drain, and the first bridge to form a passivation layer, forming a first via hole, a second via hole, a third via hole, and a fourth via hole by an etching process, and depositing a second transparent conductive material on the passivation layer. The method further includes patterning the deposited second transparent conductive material to form a first transparent conductive electrode, a second transparent conductive electrode, a third transparent conductive electrode, and a fourth transparent conductive electrode. The first transparent conductive electrode electrically connects the source to the first active layer through the first via hole, the second transparent conductive electrode electrically connects the first active layer to the first bridge through the second via hole, the third transparent conductive electrode electrically connects the second active layer to the first bridge through the third via hole, and the fourth transparent conductive electrode electrically connects the second active layer to the drain through the fourth via hole.

Another inventive aspect is a liquid crystal display. The display includes an array substrate, where the array substrate includes a display area, and a driving circuit around the display area. The driving circuit includes a plurality of TFTs, and at least one of the TFTs includes a first sub-TFT and a second sub-TFT. In addition, the first sub-TFT is electrically connected to the second sub-TFT via a first bridge, and the first bridge includes a transparent conductive material.

DETAILED DESCRIPTION OF THE PREFERRED EMBODIMENTS

In the following the technical solution in the embodiments of the disclosure will be described clearly and thoroughly in connection with accompanying drawings in the embodiments of the disclosure. It is obvious that the embodiments described are only a part of and not all of the embodiments of the disclosure. All the other embodiments based on the embodiments of the disclosure obtained by the skilled in the art without creative works fall within the protection scope of the disclosure.

Figure 1:
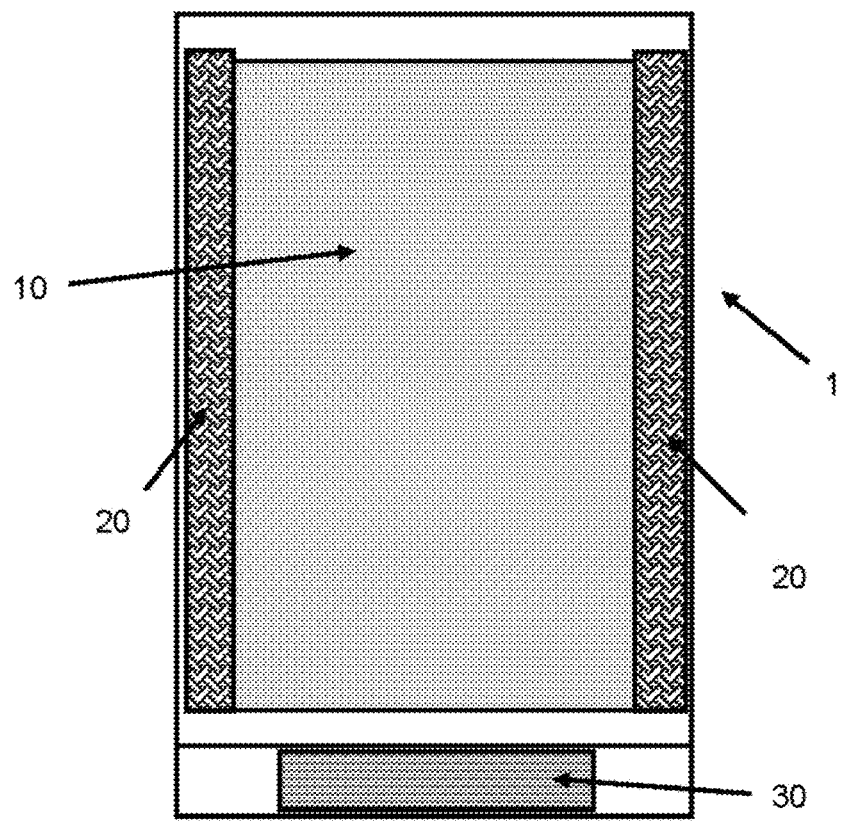
FIG. 1 is a schematic structural diagram of a display panel according to an existing technology.
Figure 2:
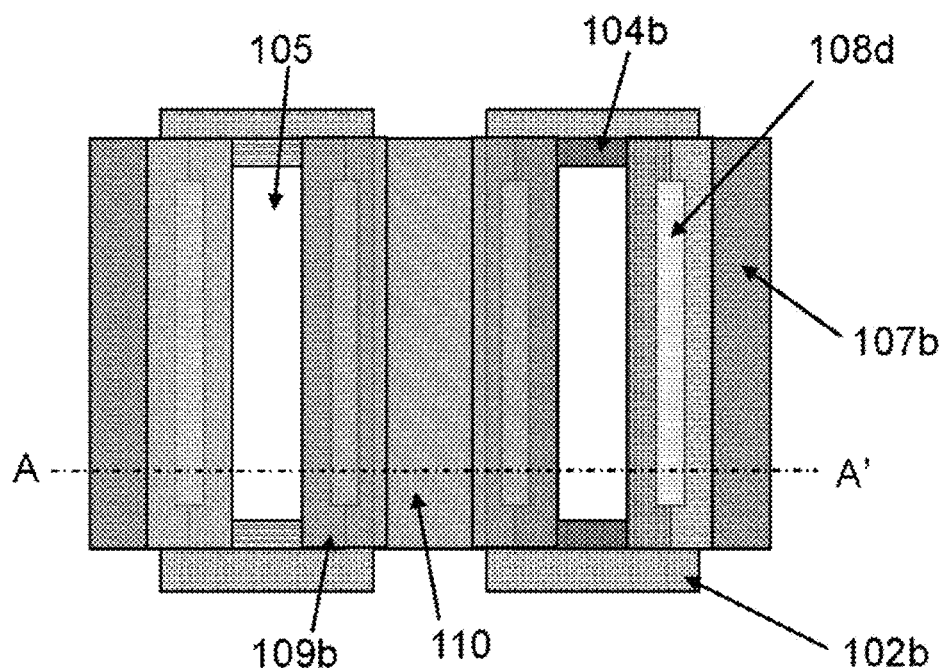
FIG. 2 is a schematic structural diagram of a thin film transistor array substrate according to an embodiment of the disclosure.
Figure 3:
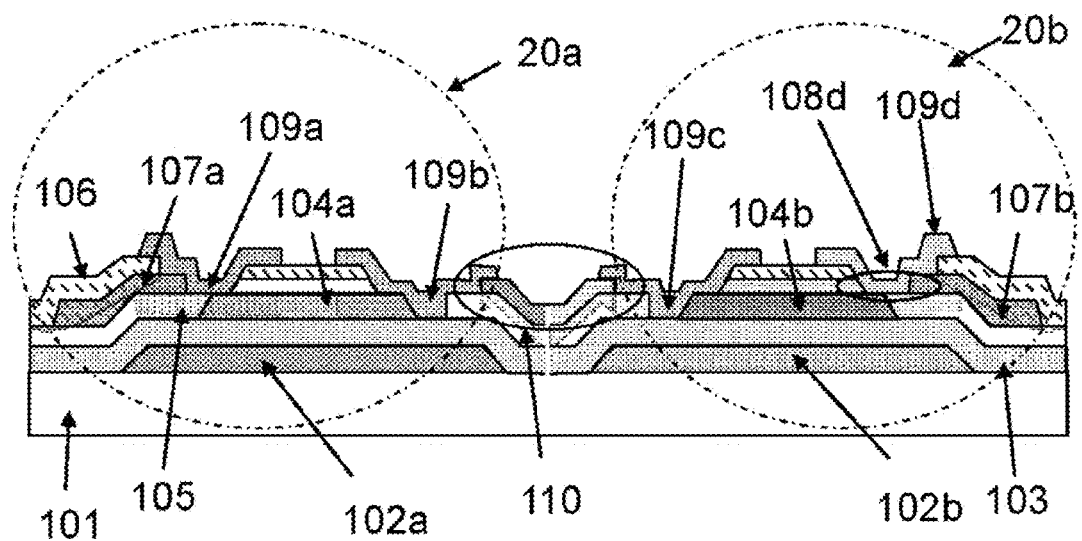
FIG. 3 is a schematic cross-section view of the thin film transistor array substrate taken along the line AA'.

An array substrate is provided according to an embodiment of the disclosure. A schematic structural diagram of a TFT in a gate driving circuit region of this array substrate may be as shown in FIG. 2. FIG. 3 is a schematic cross-section view of FIG. 2 taken along the line AA'. In the following, a thin film transistor array substrate according to the embodiment will be explained in combination with FIG. 2 and FIG. 3.

In this embodiment, the array substrate includes a display area and a driving circuit arranged around the display area. The driving circuit includes multiple thin film transistors (TFTs), and at least one of the TFTs includes a first sub-TFT 20a and a second sub-TFT 20b. The first sub-TFT 20a is electrically connected to the second sub-TFT 20b through a first bridge 110. In an embodiment, the array substrate includes a substrate 101. The first sub-TFT 20a includes: a first gate 102a disposed on the substrate 101; a gate insulating layer 103 disposed on the first gate 102a; a first active layer 104a formed on the gate insulating layer 103; an etching barrier layer 105 formed on the first active layer 104a; and a first electrode and a second electrode formed on the etching barrier layer 105 and electrically connected to the first active layer 104a. In this embodiment, the first electrode includes a source 107a, and a transparent conductive electrode 109a contacted with the source 107a. The source 107a is electrically connected to the first active layer 104a via the first transparent conductive electrode 109a. The second electrode includes a second transparent conductive electrode 109b electrically connected to the first active layer 104a, and a passivation layer 106 formed on the etching barrier layer 105. Furthermore, the second sub-TFT 20b includes: a second gate 102b; the gate insulating layer 103 disposed on the second gate 102b; a second active layer 104b formed on the gate insulating layer 103; an etching barrier layer 105 formed on the second active layer 104b; and a third electrode and a fourth electrode formed on the etching barrier layer 105 and electrically connected with the second active layer. The fourth electrode includes a drain 107b and a fourth transparent conductive electrode 109d. The drain 107b is electrically connected to the second active layer 104b via the fourth transparent conductive electrode 109d. The third electrode includes a third transparent conductive electrode 109c. This second sub-TFT 20b further includes a passivation layer 106 formed on the etching barrier layer 105. Moreover, the second transparent conductive electrode 109b is connected to the third transparent conductive electrode 109c via the first bridge 110.

Further, the gate insulating layers of the first sub-TFT 20a is disposed on the same layer as that of the second-TFT 20b, the etching barrier layer of the first sub-TFT 20a is disposed on the same layer as that of the second-TFT 20b, and the passivation layer of the first sub-TFT 20a is disposed on the same layer as that of the second-TFT 20b. The first transparent conductive electrode 109a, the second transparent conductive electrode 109b, the third transparent conductive electrode 109c and the fourth transparent conductive electrode 109d are on a same layer. In addition, the first gate 102a and the second gate 102b are disposed on the substrate 110 at intervals to form an interval region. The first bridge 110 overlaps with the interval region in a direction perpendicular to the substrate plane.

Figure 4:
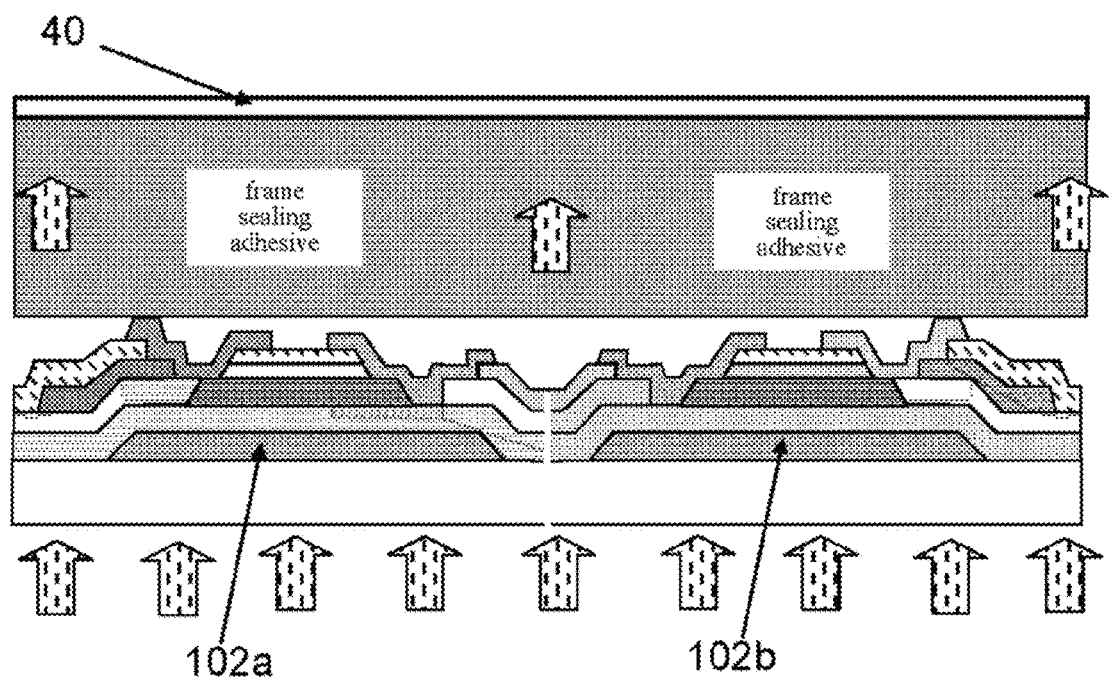
FIG. 4 is a schematic diagram of transmission effect according to the embodiment in FIG. 3.

In particular, the first bridge is made from a transparent conductive material, such as, Indium Tin Oxide (ITO) or Indium Zinc Oxide (IZO). Thus, as shown in FIG. 4, in a case where a light is irradiated to the TFT structure according to the embodiment from the side of the substrate (in the drawing, a direction indicated by arrows is a direction in which the light transmits), the gate insulating layer, the etching barrier layer, the passivation layer and the first bridge, which are disposed on the interval region between the first gate 102a and the second gate 102b, are made from transparent materials, and thus the light passing through the interval region can effectively transmit an assumed sealing adhesive frame above the TFT, so as to significantly improve a curing effect of the frame sealing adhesive.

Furthermore, when a pixel structure of the display area is in Fringe Field Switching (FFS) mode, since pixel electrodes and common electrodes need to be formed in different layers of pixel units of the display area, the first transparent conductive electrode, the second transparent conductive electrode, the third transparent conductive electrode, the fourth transparent conductive electrode are disposed at the same layer with the pixel electrode, and the first bridge is disposed at the same layer as the common electrode, thereby an additional photo-mask process may not be added and the cost may significantly be lowered.

In an embodiment, the substrate is typically made from a transparent material such glass and quartz. The substrate may also be composed of a transparent material, such as glass and quartz, and other structure thereon (such as a buffer layer). The gate is made from a metal material such as anyone of Cr, Mo, Al, Ti and Cu or an alloy thereof.

The active layer typically is in an island shape. The active layer according to the embodiment may be made from an oxide semiconductor material which may be one or more of Indium Gallium Zinc Oxide, Indium Aluminum Zinc Oxide, Indium Titanium Zinc Oxide and Indium Zinc Oxide. The active layer generally has a thickness in a range of 300 to 2000 Angstrom. Because the oxide semiconductor has mobility above 20, a narrow frame required by a smart phone or a tablet computer with a high resolution or an ultrahigh resolution (2560*1600) can be implemented in combine with the gate driving circuit.

The etching barrier layer generally covers the entire substrate and is made from an organic photosensitive material. The etching barrier layer covers the active layer, and just as its name implies that the active layer can be protected effectively from etching, when the source and drain of thin film transistor is formed by etching.

A SiNx layer, or a composite layer of SiO2 and SiNx may be generally employed as the passivation layer. The passivation layer may also be made from an organic photosensitive material. Due to a phototonus of the passivation layer, a first via hole and a second via hole may be formed within the passivation layer only by exposing, developing and the like, instead of etching. Thus, the process may be simplified.

Figure 5:
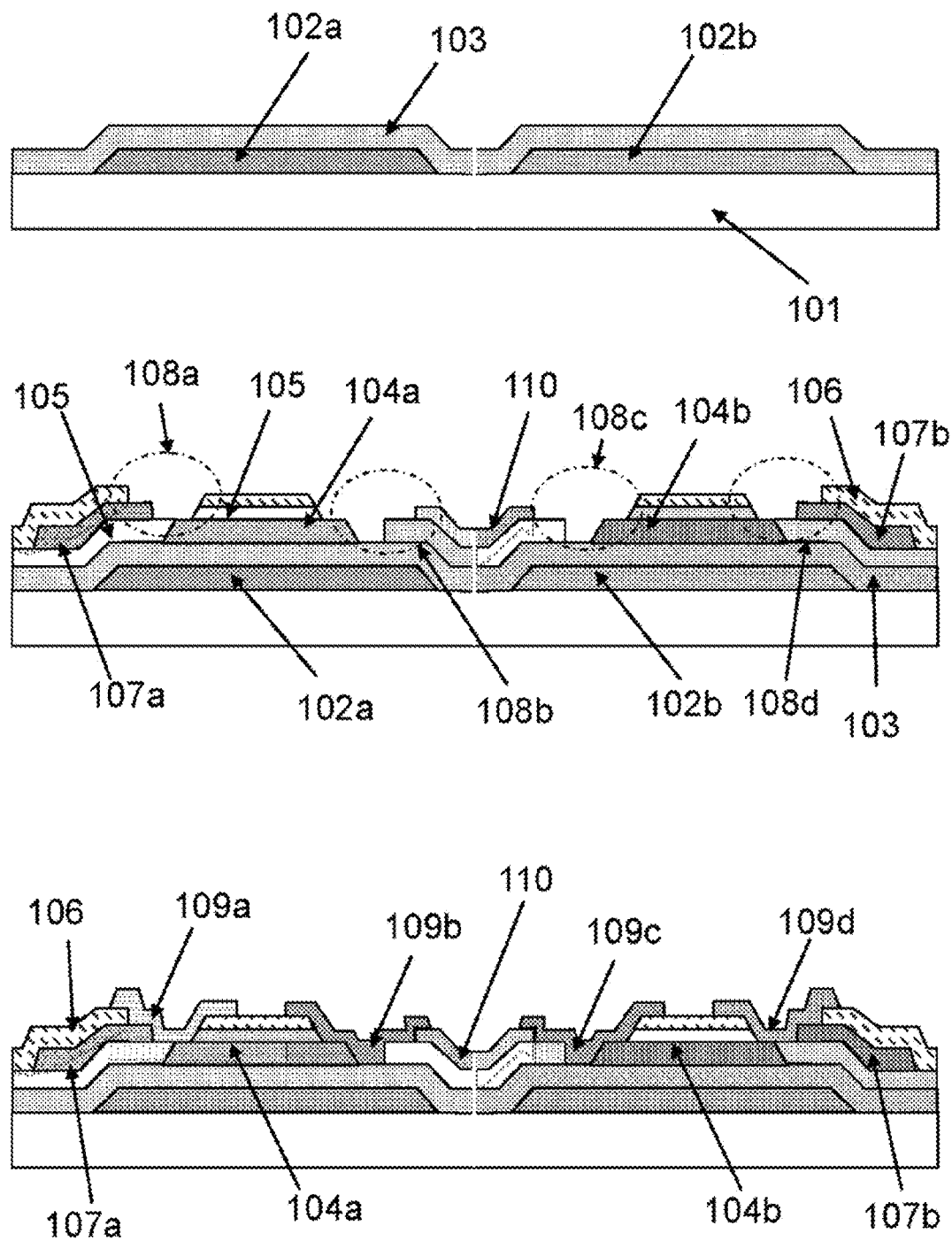
FIG. 5 is a schematic diagram of certain stages of a process for manufacturing a thin film transistor array substrate according to the embodiment in FIG. 2.

The embodiment of the disclosure further provides a process for manufacturing the TFT array substrate according to the above embodiment, as illustrated in FIG. 5. Referring to FIG. 5, the process for manufacturing the TFT array substrate according to the embodiment of the disclosure includes steps A-C.

Step A: preparing a substrate 101; depositing a first metal layer; patterning the first metal layer to form a first gate 102a and a second gate 102b; and depositing a first insulating material on the first gate 102a and the second gate 102b to form a gate insulating layer 103.

Step B: depositing a semiconductor material on the gate insulating layer 103; patterning the deposited semiconductor material to form a first active layer 104a on the first gate 102a and form a second active layer 104b on the second gate 102b; depositing a second insulating material on the first active layer 104a and the second active layer 104b to form an etching barrier layer 105; depositing a second metal material on the etching barrier layer 105; patterning the deposited second metal material to form the source 107a and the drain 107b; and depositing a first transparent conductive material; patterning the deposited first transparent conductive material to form a first bridge 110; depositing a third insulating material on the etching barrier layer 105, the source 107a, the drain 107b and the first bridge 110 to form a passivation layer 106; and forming a first via hole 108a, a second via hole 108b, a third via hole 108c and the fourth via hole 108d by an etching process.

Step C: depositing a second transparent conductive material on the passivation layer 106; and patterning the deposited second transparent conductive material to form a first transparent conductive electrode 109a, a second transparent conductive electrode 109b, a third transparent conductive electrode 109c and a fourth transparent conductive electrode 109d; where the first transparent conductive electrode 109a electrically connects the source 107a to the first active layer 104a through the first via hole, the second transparent conductive electrode 109b electrically connects the first active layer 104a to the first bridge 110 through the second via hole, the third transparent conductive electrode 109c electrically connects the second active layer 104b to the first bridge 110 through the third via hole, the fourth transparent conductive electrode 109d electrically connects the second active layer 104b to the drain 107b through the fourth via hole.

A TFT structure according to the above embodiment may be obtained by the above manufacturing method.

Figure 6:
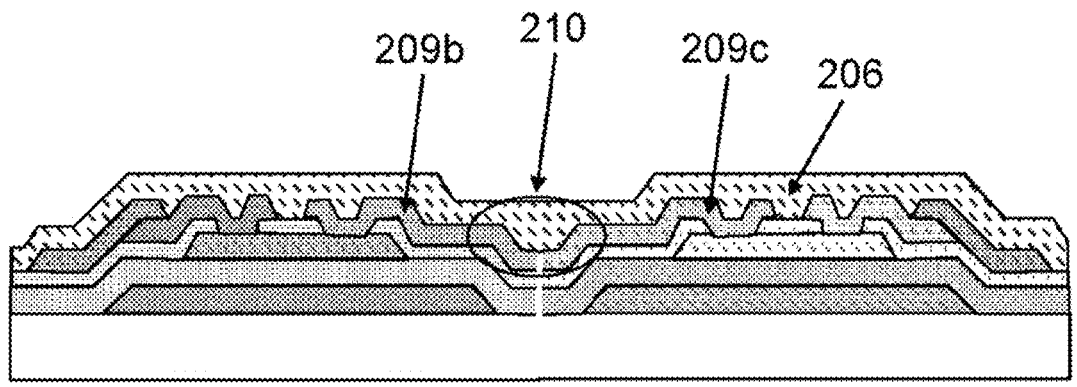
FIG. 6 is a schematic structural diagram of a thin film transistor array substrate according to another embodiment of the disclosure.

An embodiment of the disclosure further provides an array substrate. A schematic structural diagram of a pixel region of this array substrate may be illustrated as in FIG. 6. In the following, a thin film transistor array substrate according to the embodiment will be explained in combination with FIG. 6. A part of this embodiment same as the previous embodiment will be omitted, the difference there between is described as follows.

In the array substrate according to the embodiment, the second transparent conductive electrode 209b, the third transparent conductive electrode 209c and the first bridge 210 are on a same layer, and the passivation layer 206 is disposed thereon. In this way, compared to the previous embodiment, a transparent conductive electrode may be omitted, and the transparent conductive electrode is formed below the passivation layer to avoid exposing the gate driving circuit. Thus, a risk of Electro-Static Discharge (EDS) is reduced.

Figure 7:
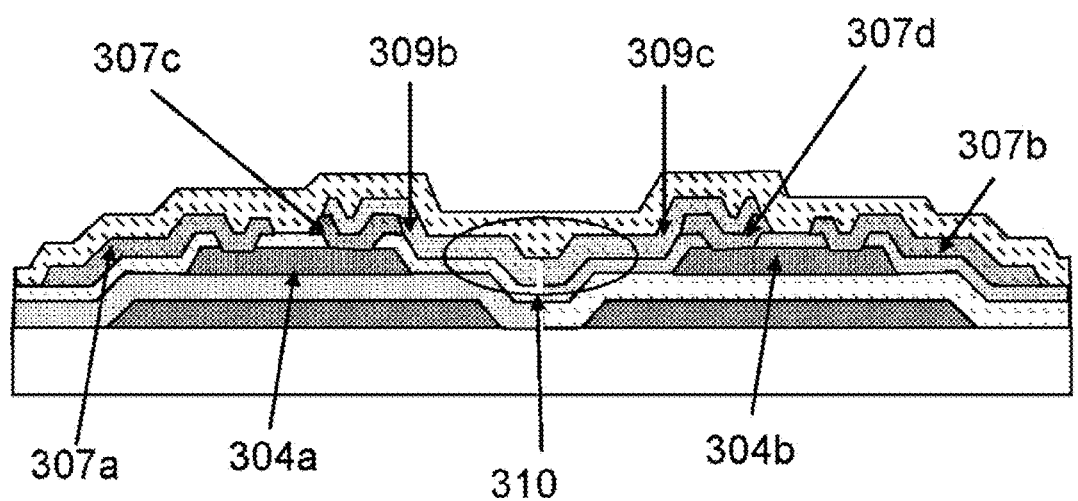
FIG. 7 is a schematic structural diagram of a thin film transistor array substrate according to another embodiment of the disclosure.

An embodiment of the disclosure further provides an array substrate. A schematic structural diagram of a pixel region of this array substrate may be illustrated as in FIG. 7. In the following, a thin film transistor array substrate will be explained in combination with FIG. 7. A part of this embodiment same as the previous embodiment will be omitted, the difference there between is described as follows.

In the array substrate according to the embodiment, the first electrode is the source 307a directly contacting with the first active layer 304a. The second electrode includes the second transparent conductive electrode 309b and the second metal layer 307c disposed between the first active layer 304a and the second transparent conductive electrode 309b. The second transparent conductive electrode 309b is electrically connected to the first active layer 304a via the second metal layer 307c. The third electrode includes the third transparent conductive electrode 309c and the third metal layer 307d disposed between the second active layer 340b and the third transparent conductive electrode 309c. The third transparent conductive electrode 309c is electrically connected to the second active layer 304b via the third metal layer 307d. The fourth electrode includes the drain 307b directly contacting with the second active layer 304b. The second transparent conductive electrode 309b, the third transparent conductive electrode 309c and the first bridge 310 are on a same layer and are formed in a same process.

In the embodiment, the transparent conductive electrode and the first bridge are on a same layer, thus simplifying the process and reducing the cost. Besides, since the electrodes which are electrically connected to the first active layers and the second active layers of the first and second sub-TFTs are made from a metal material, the TFT structure according to this embodiment may be applied to a TFT device in which the active layer is made from an oxide semiconductor or made from a-Si. Furthermore, in the case that the active layer is made from an oxide semiconductor, the third metal layer and the fourth metal layer in the present embodiment may also be removed, and thus the first active layer directly contacts with the second transparent conductive electrode and the second active layer directly contacts with the third transparent conductive electrode, so as to connect the first active layer to the second active layer.

Figure 8:
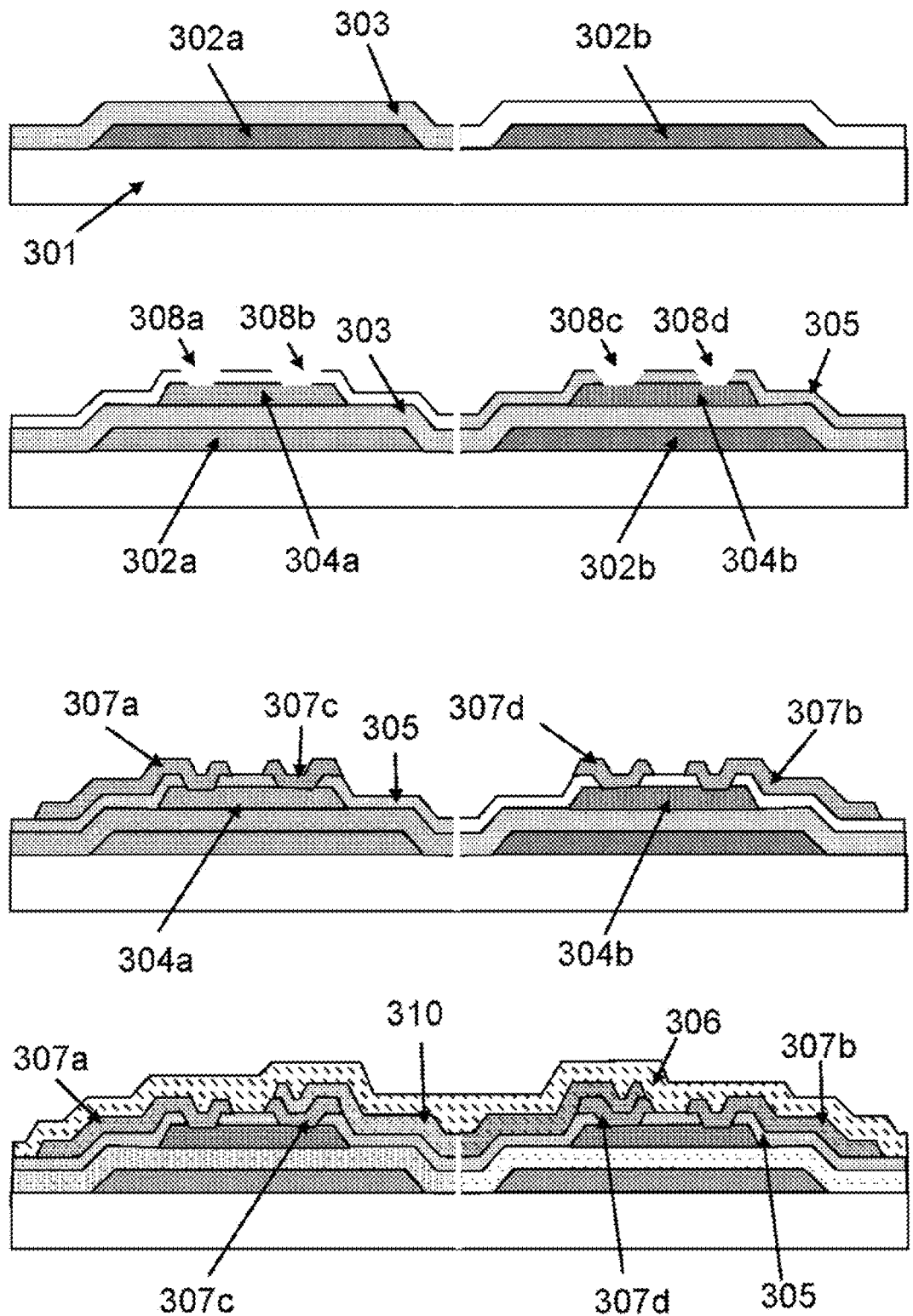
FIG. 8 is a schematic diagram of certain stages of a process for manufacturing the thin film transistor array substrate according to the embodiment in FIG. 7.

An embodiment according to the disclosure further provides a process for manufacturing a TFT array substrate according to the above embodiments, as shown in FIG. 8. Referring to FIG. 8, the process for manufacturing the TFT array substrate according to the embodiment of the disclosure includes steps A-D.

Step A: preparing a substrate 301; depositing a first metal layer; patterning the first metal layer to form a first gate 302a and a second gate 302b; and depositing a first insulating material on the first gate 302a and the second gate 302b to form a gate insulating layer 303.

Step B: depositing a semiconductor material on the gate insulating layer 303; patterning the deposited semiconductor material to form a first active layer 304a on the first gate 302a and form a second active layer 304b on the second gate 302b; depositing a second insulating material on the first active layer 304a and the second active layer 304b to form an etching barrier layer 305; and forming a first via hole 308a and a second via hole 308b on the first active layer 304a by an etching process, and forming a third via hole 308c and a fourth via hole 308d on the second active layer 304b by an etching process.

Step C: depositing a second metal material on the etching barrier layer 305; patterning the deposited second metal material to form a source 307a, a second metal layer 307c, a third metal layer 307d and a drain 307b; where the source 307a is electrically connected to the first active layer 304a through the first via hole, the second metal layer 307c is electrically connected to the first active layer 304a through the second via hole, the third metal layer 307d is electrically connected to the second active layer 304b through the third via hole, and the drain 307b is electrically connected to the second active layer 304b through the fourth via hole.

Step D: depositing a first transparent conductive material, patterning the deposited first transparent conductive material to form a first bridge 310 for electrically connecting the second metal layer 307c to the third metal layer 307d; depositing a third insulation material on the etching barrier layer 305, the source 307a, the drain 307b and the first bridge 310 to form a passivation layer 306.

A TFT structure according to the above embodiment may be obtained by the above manufacturing method.

Figure 9:
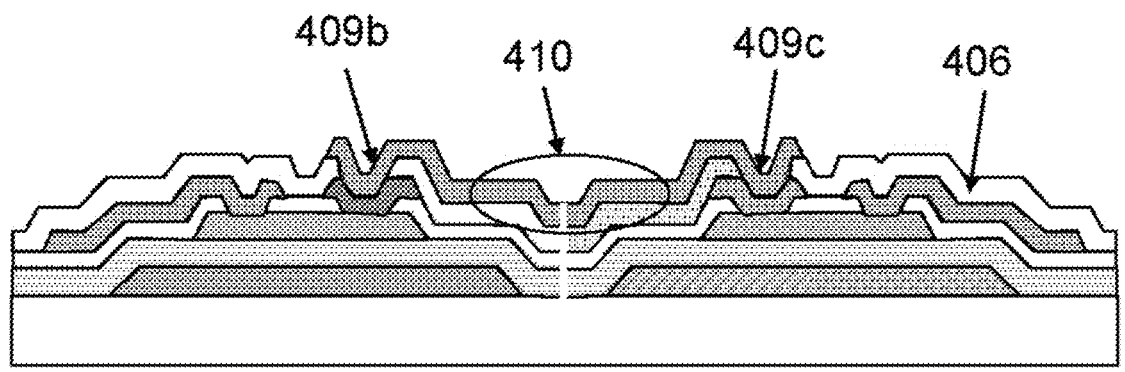
FIG. 9 is a schematic structural diagram of a thin film transistor array substrate according to another embodiment of the disclosure.

An embodiment of the disclosure further provides an array substrate. A schematic structural diagram of a pixel region of this array substrate may be illustrated as in FIG. 9. In the following, a thin film transistor array substrate will be explained in combination with FIG. 9. A part of this embodiment same as the previous embodiment will be omitted, and the difference there between is described as follows.

In the array substrate according to the embodiment, the second transparent conductive electrode 409b, the third transparent conductive electrode 409c and the first bridge 410 are on a same layer, and the passivation layer 406 is disposed thereon. This TFT structure may also be applied to Twisted Nematic Liquid Crystal Display (TN-LCD) structure or Organic Electroluminescence Display (OLED) structure. Besides, since a metal electrode directly contacts with the active layer, this structure may be suitable to a structure in which the active layer is made of an oxide semiconductor or made from a-Si.

Figure 10:
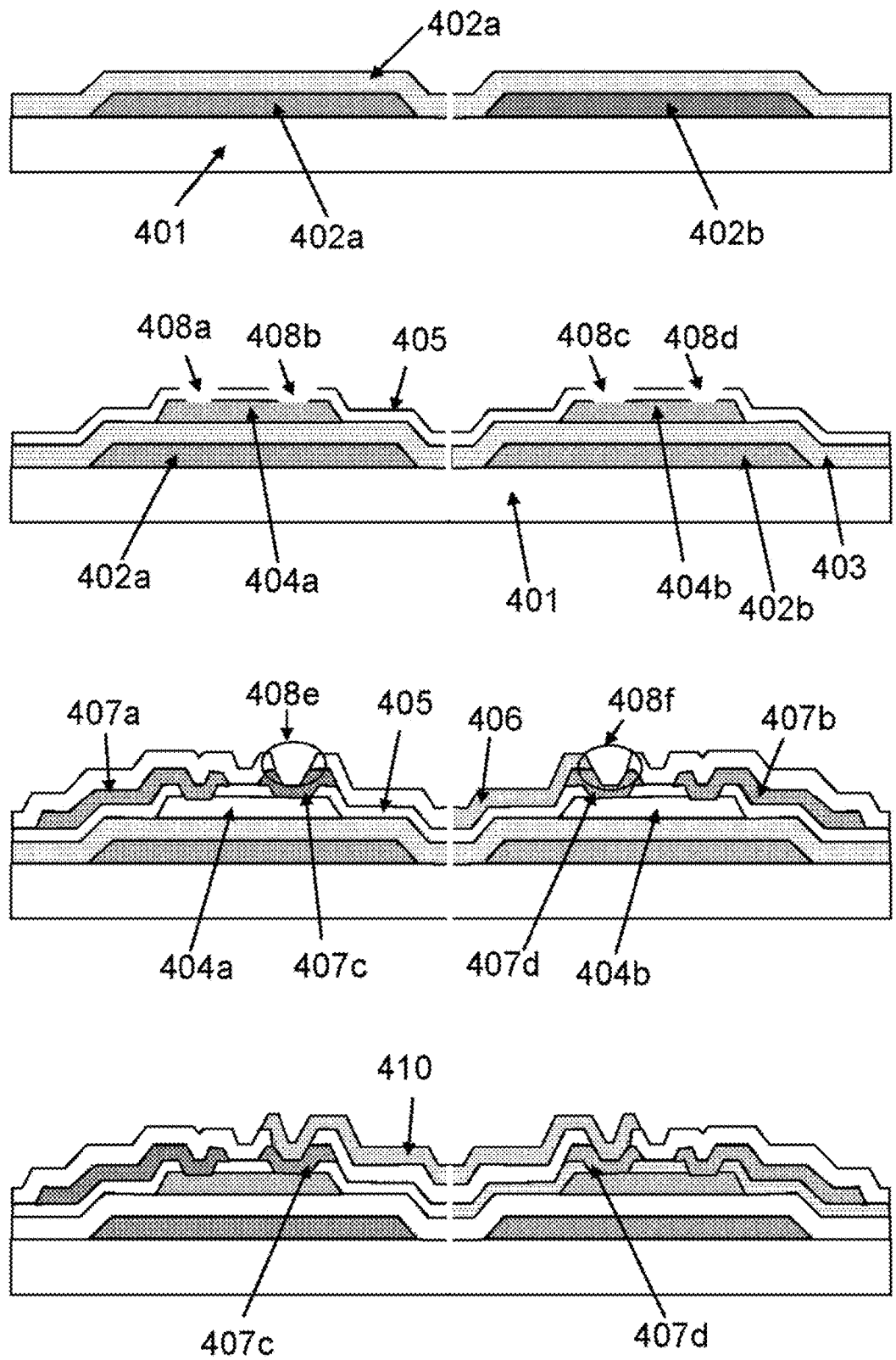
FIG. 10 is a schematic diagram of certain stages of a process for manufacturing the thin film transistor array substrate according to the embodiment in FIG. 9.

An embodiment according to the disclosure further provides a process for manufacturing a TFT array substrate according to the above embodiments, as shown in FIG. 10. Referring to FIG. 10, the process for manufacturing the TFT array substrate according to the embodiment of the disclosure includes steps A-D.

Step A: preparing a substrate 401; depositing a first metal layer; patterning the deposited first metal layer to form a first gate 402a and a second gate 402b; and depositing a first insulating material on the first gate 402a and the second gate 402b to form a gate insulating layer 403.

Step B: depositing a semiconductor material on the gate insulating layer 403; patterning the deposited semiconductor material to form a first active layer 404a on the first gate 402a and form a second active layer 404b on the second gate 402b; depositing a second insulating material on the first active layer 404a and the second active layer 404b to form an etching barrier layer 405; and forming a first via hole 408a and a second via hole 408b on the first active layer 404a by an etching process, and forming a third via hole 408c and the fourth via hole 408d on the second active layer 404b by the etching process.

Step C: depositing a second metal material on the etching barrier layer 405; patterning the deposited second metal material to form a source 407a, a second metal layer 407c, a third metal layer 407d and a drain 407b; where the source 407a is electrically connected to the first active layer 404a through the first via hole, the second metal layer 407c is electrically connected to the first active layer 404a through the second via hole, the third metal layer 407d is electrically connected to the second active layer 404b through the third via hole, and the drain 407b is electrically connected to the second active layer 404b through the fourth via hole; depositing a third insulation material on the etching barrier layer 405, the source 407a and the drain 407b to form a passivation layer 406, and forming a fifth via hole 408e and the sixth via hole 408f by the etching process.

Step D: depositing a first transparent conductive material; and patterning the deposited first transparent conductive material to form a first bridge 410, where the first bridge 410 is electrically connected to the second metal layer 407c through the fifth via hole and electrically connected to the third metal layer 407d through the sixth via hole.

A TFT structure according to the above embodiment may be obtained by the above manufacturing method.

A liquid crystal display is further provided according to an embodiment of the disclosure, which includes any one of the above array substrates.

The above thin film transistors according to the disclosure and the thin film transistors manufactured by the above methods according to the disclosure may be applied in a general flat panel display device such as LCD or OLED.

A term "on" described in the disclosure refers to disposition on a surface of a substrate, may refer to a direct contact between materials or an arrangement at intervals.

The above embodiments are for the purpose of better explaining the technical solution of the disclosure. As known by the skilled in the art, the disclosure also includes solutions substantially equivalent to or identical to the technical solutions according to the above embodiments, and the claims of the disclosure is not limited by the particular situation of the embodiment. Furthermore, although the preferred embodiments of the present disclosure have been described, additional alterations and modifications may be made to these embodiments once the skilled in the art acknowledges basic creative concepts. Therefore, the following claims are intended to be construed as including the preferred embodiments and all the alterations and modifications that fall within the scope of the disclosure.

Obviously, various alterations and changes may be made by the skilled in the art without departing from the spirit and scope of the disclosure. Thus, if these alterations and changes fall within the scope of the claims of the disclosure and identical technologies thereof, the disclosure is intended to include these alterations and changes therein.

What is claimed is:

1. An array substrate comprising a display area and a driving circuit arranged around the display area, wherein the driving circuit comprises a plurality of TFTs, and at least one of the TFTs comprises a first sub-TFT and a second sub-TFT, and wherein
    the first sub-TFT is electrically connected to the second sub-TFT via a first bridge, the first bridge is made from a transparent conductive material, and the array substrate comprises a substrate, wherein, and the first sub-TFT comprises a first gate disposed on the substrate, a gate insulating layer, an etching barrier layer, and a passivation layer;
    and the second sub-TFT comprises a second gate disposed on the substrate, a gate insulating layer, an etching barrier layer, and a passivation layer,
    wherein an interval region is formed between the first gate and the second gate on the substrate, and a portion of the gate insulating layers, a portion of the etching barrier layers and a portion of the passivation layers, which overlap the interval region in a direction vertical to the substrate, are made from transparent materials.

2. The array substrate according to claim 1, wherein the transparent conductive material is ITO or IZO.

3. The array substrate according to claim 1, wherein
    the first sub-TFT the gate insulating layer is disposed on the first gate, a first active layer is formed on the gate insulating layer, the etching barrier layer is formed on the first active layer, a first electrode and a second electrode are formed on the etching barrier layer and electrically connected to the first active layer, and the passivation layer is formed on the etching barrier layer; and in the second sub-TFT the gate insulating layer is disposed on the second gate, a second active layer is formed on the gate insulating layer, the etching barrier layer is formed on the second active layer, a third electrode and a fourth electrode are formed on the etching barrier layer and electrically connected to the second active layer, and the passivation layer is formed on the etching barrier layer, wherein the first bridge overlaps with the interval region in a vertical direction.

4. The array substrate according to claim 3, wherein:
the first electrode comprises a source and a first transparent conductive electrode, the source is electrically connected to the first active layer via the first transparent conductive electrode;
the second electrode comprises a second transparent conductive electrode;
the fourth electrode comprises a drain and a fourth transparent conductive electrode, the drain is electrically connected to the second active layer via the fourth transparent conductive electrode; and
the third electrode comprises a third transparent conductive electrode,
the second transparent conductive electrode is electrically connected to the third transparent conductive electrode via the first bridge.

5. The array substrate according to claim 4, wherein the first transparent conductive electrode, the second transparent conductive electrode, the third transparent conductive electrode and the fourth transparent conductive electrode are on a same layer.

6. The array substrate according to claim 4, wherein the second transparent conductive electrode, the third transparent conductive electrode and the first bridge are on a same layer, and the passivation layer is disposed on the second transparent conductive electrode, the third transparent conductive electrode and the first bridge.

7. The array substrate according to claim 3, wherein:
the first electrode comprises a source directly contacting with the first active layer;
the second electrode comprises a second transparent conductive electrode;
the third electrode comprises a third transparent conductive electrode; and
the fourth electrode comprises a drain directly contacting with the second active layer,
the second transparent conductive electrode, the third transparent conductive electrode and the first bridge are on a same layer.

8. The array substrate according to claim 7, wherein the second electrode further comprises a second metal layer disposed between the first active layer and the second transparent conductive electrode, wherein the second transparent conductive electrode is electrically connected to the first active layer via the second metal layer; and
the third electrode further comprises a third metal layer disposed between the second active layer and the third transparent conductive electrode, wherein the third transparent conductive electrode is electrically connected to the second active layer via the third metal layer.

9. The array substrate according to claim 8, wherein the second transparent conductive electrode, the third transparent conductive electrode and the first bridge are formed on the passivation layer.

10. The array substrate according to claim 3, wherein the gate insulating layer of the first sub-TFT and the gate insulating layer of the second sub-TFT are on a same layer, the etching barrier layer of the first sub-TFT and the etching barrier layer of the second sub-TFT are on a same layer and the passivation layer of the first sub-TFT and the passivation layer of the second sub-TFT are on a same layer.

11. The array substrate according to claim 3, wherein the active layer is made from an oxide semiconductor or a-Si.

12. A liquid crystal display, comprising an array substrate, wherein the array substrate comprises a display area and a driving circuit arranged around the display area, the driving circuit comprises a plurality of TFTs, and at least one of the TFTs comprises a first sub-TFT and a second sub-TFT, and wherein
the first sub-TFT is electrically connected to the second sub-TFT via a first bridge, the first bridge is made from a transparent conductive material, and the array substrate comprises a substrate, wherein, and the first sub-TFT comprises a first gate disposed on the substrate, a gate insulating layer, an etching barrier layer, and a passivation layer;
and the second sub-TFT comprises a second gate disposed on the substrate, a gate insulating layer, an etching barrier layer, and a passivation layer,
wherein an interval region is formed between the first gate and the second gate on the substrate, and a portion of the gate insulating layers, a portion of the etching barrier layers and a portion of the passivation layers, which overlap the interval region in a direction vertical to the substrate, are made from transparent materials.

13. The liquid crystal display according to claim 12, wherein
in first sub-TFT the gate insulating layer is disposed on the first gate, a first active layer is formed on the gate insulating layer, the etching barrier layer is formed on the first active layer, a first electrode and a second electrode are formed on the etching barrier layer and electrically connected to the first active layer, and the passivation layer is formed on the etching barrier layer; and
in the second sub-TFT the gate insulating layer is disposed on the second gate, a second active layer is formed on the gate insulating layer, the etching barrier layer is formed on the second active layer, a third electrode and a fourth electrode are formed on the etching barrier layer and electrically connected to the second active layer, and the passivation layer is formed on the etching barrier layer,
wherein the first bridge overlaps with the interval region in a vertical direction.

14. The liquid crystal display according to claim 13, wherein:
the first electrode comprises a source and a first transparent conductive electrode, the source is electrically connected to the first active layer via the first transparent conductive electrode;
the second electrode comprises a second transparent conductive electrode;
the fourth electrode comprises a drain and a fourth transparent conductive electrode, the drain is electrically connected to the second active layer via the fourth transparent conductive electrode; and
the third electrode comprises a third transparent conductive electrode, the second transparent conductive electrode is electrically connected to the third transparent conductive electrode via the first bridge.

15. The liquid crystal display according to claim 14, wherein the first transparent conductive electrode, the second transparent conductive electrode, the third transparent conductive electrode and the fourth transparent conductive electrode are on a same layer.

16. The liquid crystal display according to claim 14, wherein the second transparent conductive electrode, the third transparent conductive electrode and the first bridge are on a same layer, and the passivation layer is disposed on the second transparent conductive electrode, the third transparent conductive electrode and the first bridge.

17. The liquid crystal display according to claim 13, wherein:
the first electrode comprises a source directly contacting with the first active layer;
the second electrode comprises a second transparent conductive electrode;
the third electrode comprises a third transparent conductive electrode; and
the fourth electrode comprises a drain directly contacting with the second active layer,
the second transparent conductive electrode, the third transparent conductive electrode and the first bridge are on a same layer.

18. The liquid crystal display according to claim 17, wherein
the second electrode further comprises a second metal layer disposed between the first active layer and the second transparent conductive electrode, wherein the second transparent conductive electrode is electrically connected to the first active layer via the second metal layer; and
the third electrode further comprises a third metal layer disposed between the second active layer and the third transparent conductive electrode, wherein the third transparent conductive electrode is electrically connected to the second active layer via the third metal layer.

19. A method of manufacturing an array substrate comprising:
Step A: preparing a substrate; forming a first gate and a second gate on the substrate, and forming a gate insulating layer on the first gate and the second gate;
Step B: forming a first active layer and a second active layer on the gate insulating layer, to form the first active layer on the first gate and to form the second active layer on the second gate; forming an etching barrier layer on the first active layer and the second active layer; forming a source and a drain on the etching barrier layer; forming a first bridge; and forming a passivation layer on the etching barrier layer, the source, the drain and the first bridge; and
Step C: forming a first transparent conductive electrode, a second transparent conductive electrode, a third transparent conductive electrode and a fourth transparent conductive electrode on the passivation layer; wherein the first transparent conductive electrode electrically connects the source to the first active layer, the second transparent conductive electrode electrically connects the first active layer to the first bridge, the third transparent conductive electrode electrically connects the second active layer to the first bridge, the fourth transparent conductive electrode electrically connects the second active layer to the drain
wherein an interval region is formed between the first gate and the second gate on the substrate, and a portion of the gate insulating layer, a portion of the etching barrier layer and a portion of the passivation layer, which overlap the interval region in a direction vertical to the substrate, are made from transparent materials.

20. The method according to claim 19, wherein the second transparent conductive electrode, the third transparent conductive electrode and the first bridge are on a same layer, and formed in a same process.

* * * * *